United States Patent
Morgado et al.

(10) Patent No.: US 8,963,754 B2
(45) Date of Patent: Feb. 24, 2015

(54) CIRCUIT FOR DIGITIZING A SUM OF SIGNALS

(71) Applicants: IMEC, Leuven (BE); Stichting IMEC Nederland, Eindhoven (NL); Katholieke Universiteit Leuven, K.U. LEUVEN R&D, Leuven (BE)

(72) Inventors: Alonso Morgado, Seville (ES); Serena Porrazzo, Eindhoven (NL); Francesco Cannillo, Leuven (BE)

(73) Assignees: IMEC, Leuven (BE); Stichting IMEC Nederland, Eindhoven (NL); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days.

(21) Appl. No.: 14/022,351

(22) Filed: Sep. 10, 2013

(65) Prior Publication Data

US 2014/0070972 A1 Mar. 13, 2014

(30) Foreign Application Priority Data

Sep. 10, 2012 (EP) .................................... 12183714

(51) Int. Cl.
*H03M 3/00* (2006.01)

(52) U.S. Cl.
CPC ............... *H03M 3/32* (2013.01); *H03M 3/426* (2013.01); *H03M 3/452* (2013.01)
USPC ........... 341/143; 341/118; 341/120; 341/155; 341/172

(58) Field of Classification Search
CPC ....... H03M 3/43; H03M 3/454; H03M 3/458; H03M 3/30; H03M 3/39
USPC .......................................... 341/143, 155, 172
See application file for complete search history.

(56) References Cited

U.S. PATENT DOCUMENTS 5,274,375 A * 12/1993 Thompson ..................... 341/143
6,078,621 A * 6/2000 Eastty et al. ................... 375/247

(Continued)

FOREIGN PATENT DOCUMENTS

CN 102324941 A 1/2012

OTHER PUBLICATIONS

Zhang, Jinghua et al., "A 0.6-V 82-dB 28.6-µW Continuous-Time Audio Delta-Sigma Modulator", IEEE Journal of Solid-State Circuits, vol. 46, No. 10, Oct. 2011, pp. 2326-2335.

(Continued)

*Primary Examiner* — Linh Nguyen
(74) *Attorney, Agent, or Firm* — McDonnell Boehnen Hulbert & Berghoff LLP (57) ABSTRACT

A circuit for digitizing a sum of a first input signal and a plurality of second input signals has a passive adder that sums the second input signals and outputs a summation signal and a multi-bit quantizer circuit. The quantizer circuit compares the summation signal at a first comparator input with a signal at a second comparator input, which is derived from the first input signal and has an appropriate polarity so that the difference between the summation signal and the signal at the second comparator input is indicative of the sum of the first input signal and the plurality of second input signals. The comparator also produces a comparator output signal based on the sum of the first input signal and the plurality of second input signals. The quantizer circuit also has a control logic block for determining a multi-bit representation of the sum from the comparator output signal.

13 Claims, 6 Drawing Sheets

(56) References Cited

U.S. PATENT DOCUMENTS

| | | | | |
|---|---|---|---|---|
| 6,707,403 | B1* | 3/2004 | Hurrell | 341/120 |
| 6,954,159 | B1* | 10/2005 | Cooper et al. | 341/143 |
| 7,176,821 | B1* | 2/2007 | Williams et al. | 341/143 |
| 7,248,193 | B2* | 7/2007 | Fujimoto | 341/143 |
| 7,420,491 | B2* | 9/2008 | Oprescu | 341/122 |
| 7,495,589 | B1* | 2/2009 | Trifonov et al. | 341/118 |
| 7,710,304 | B2* | 5/2010 | Kumamoto et al. | 341/155 |
| 2005/0052300 | A1* | 3/2005 | Ranganathan | 341/143 |
| 2008/0297385 | A1* | 12/2008 | Clara et al. | 341/143 |
| 2011/0187571 | A1* | 8/2011 | Lin et al. | 341/143 |
| 2012/0062405 | A1* | 3/2012 | Loeda et al. | 341/143 |
| 2012/0212361 | A1* | 8/2012 | Lai et al. | 341/143 |
| 2012/0319881 | A1* | 12/2012 | Huang et al. | 341/143 |

OTHER PUBLICATIONS

Zhang, Jinghua et al., "A 1.2-V 2.7-mW 160MHz Continuous-Time Delta Sigma Modulator with Input-Feedforward Structure", Custom Integrated Circuits Conference, 2009 IEEE, Sep. 13-16, 2009, pp. 475-478.

Park, Hyunsik et al., "A 0.7-V 870-μW Digital-Audio CMOS Sigma-Delta Modulator", IEEE Journal of Solid-State Circuits, vol. 44, No. 4, Apr. 2009, pp. 1078-1088.

Liu et al., "A 95dB SNDR Audio ΔΣ Modulator in 65nm CMOS", Custom Integrated Circuits Conference, 2011 IEEE, Sep. 19-21, 2011 pp. 1-4.

Li, Hongyi et al., "Two Effective Single-Loop High-Performance Sigma-Delta Modulators Based on 0.13μm CMOS", Solid-State and Integrated Circuit Technology (ICSICT), 2010 10th IEEE International Conference, Nov. 1-4, 2011, pp. 342-344.

Liu, Liyuan et al., "A 1V 350μW 92dB SNDR 24 kHz ΔΣ Modulator in 0.18μm CMOS", IEEE Asian Solid-State Circuits Conference, Nov. 8-10, 2010, Beijing, China, pp. 1-4.

Yu, Wenhuan et al., "82 dB SNDR 20-Channel Incremental ADC with Optimal Decimation Filter and Digital Correction", Custom Integrated Circuits Conference (CICC), 2010 IEEE, Sep. 19, 2010, pp. 1-4.

European Search Report, European Patent Application No. 12183714.0, dated Mar. 25, 2013.

* cited by examiner

CIRCUIT FOR DIGITIZING A SUM OF SIGNALS

CROSS REFERENCE TO RELATED APPLICATIONS

Pursuant to the provisions of 35 U.S.C. §119(b), this application claims priority to EP12183714.0 filed Sep. 10, 2012, the entire contents of which are incorporated herein by reference.

FIELD

The present invention is related to the field of circuits for the summation of a multitude of signals. More in particular, it relates to the field of analog-to-digital converters wherein such circuits are applied.

BACKGROUND

In order to digitize a sum of signals there are basically two options available: either all signals are digitized with different analog-to-digital converters (ADCs) and combined in the digital domain, or all signals are summed in the analog domain to be later digitized by a single ADC. Summation in the analog domain is not straightforward and usually additional circuitry is needed, eventually resulting in higher power and area consumption. Also, the use of a number of ADCs entails higher power and area overhead.

These circuits for digitizing a sum of signals can be directly embedded in a feed-forward (FF) sigma-delta ADC, which is traditionally used in a wide variety of applications, such as instrumentation, biomedical, audio and radio.

In fact, sigma-delta modulators using multi-bit quantization with FF topologies achieve high-resolution with relatively low power dissipation. Unfortunately, the addition and quantization operations of multi-bit FF topologies face a power/resolution trade-off due to conflicting requirements on the adder and quantizer. Hence, there is an ongoing effort in implementing architectures that perform the addition while also reducing the number of comparators used in the multi-bit quantizer to further reduce the power consumption.

Figure 1:
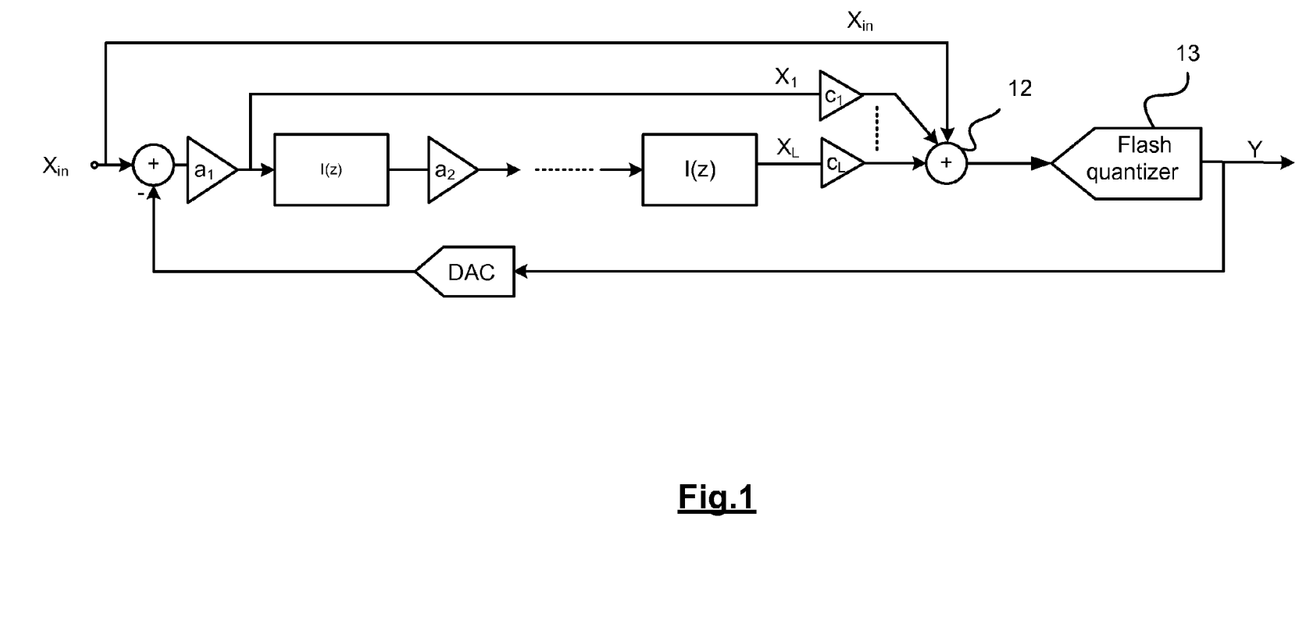
FIG. 1 illustrates a standard discrete time feed-forward second-order sigma-delta modulator architecture as known in the art.

FIG. 1 shows an example of a standard multi-bit single-loop feed-forward $\Sigma\Delta$ modulator architecture. An analog adder 12 is used to perform the summation of the feed-forward paths while a flash quantizer 13 is traditionally employed for the internal multi-bit quantization. In FIG. 1 the power consumption and/or design constraints of the adder and quantizer blocks may become critical. The analog adder 12 can be implemented as an active or passive adder. On the one hand, an active adder is a power hungry solution because of the large voltage swing at its output and the large load from the flash quantizer. On the other hand, a passive adder is usually implemented as a capacitor divider that attenuates the input signal at the input of the quantizer, so comparator offset requirements become more stringent. A flash quantizer guarantees a low-latency quantization but requires high power consumption and large area (both exponentially scaling with quantizer resolution).

In feed-forward topologies the input signal $X_{in}$, and the integrator outputs (state variables) $X_i$ (i=1 ... L) are added at the input of the quantizer 13 through the feed-forward coefficients $c_i$ (i=1 ... L). As aforementioned, two approaches are usually available to implement this addition, i.e. active or passive addition.

Figure 2:
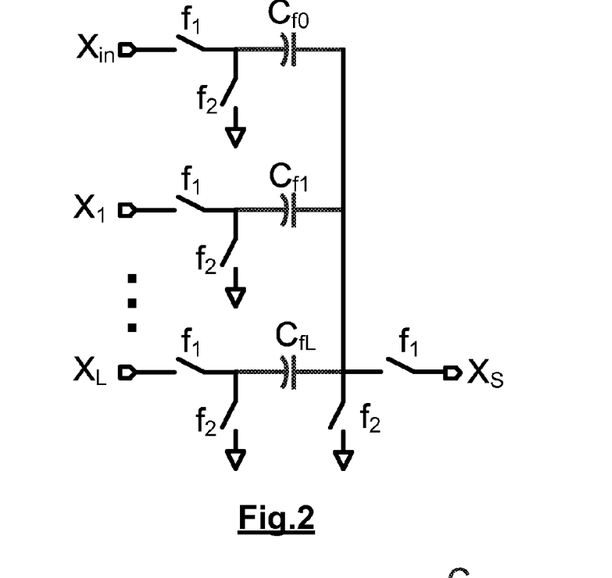
FIG. 2 represents a circuit for a passive addition.

In case a passive addition is applied, the signal addition does not rely on any active circuitry. It is implemented with a switched capacitor network consisting of L switched capacitor branches as shown in FIG. 2. If $\Sigma_{i=1}^{L} c_i$ the capacitors used to implement the FF coefficients are integer fractions of the capacitor $C_{f0}$:

$$C_{fi} = c_i \cdot C_{f0} = \frac{c_i^*}{c_T} \cdot C_{f0} = c_i^* \cdot C_u \text{ for } (i = 1 \ldots L) \tag{1}$$

where $$C_{f0} = C_u \cdot \sum_{i=1}^{L} c_i = c_T \cdot C_u \tag{2}$$

If $\Sigma_{i=1}^{L} c_i$ the capacitors $C_{fi}$ are implemented as integer multiple of the unit capacitor $C_u$:

$$C_{fi} = c_i \cdot C_u \quad C_{fi} = c_i \cdot C_u \tag{3}$$

The value of $C_u$ is determined by taking into account mismatch constraints.

The signal at the adder output is attenuated by a factor $\alpha = 1 + \Sigma_{i=1}^{L} c_i$. This attenuation renders the quantizer offset requirements more stringent and, in turn, the quantizer power consumption higher. In single-bit implementations the amplitude information is not used because only the sign information is detected. In multi-bit implementations the attenuation must be compensated by a corresponding amplification a in order to re-establish signal dynamic at the quantizer input. This amplification is power consuming as it should settle fast and it should reach full scale output dynamic.

Figure 3:
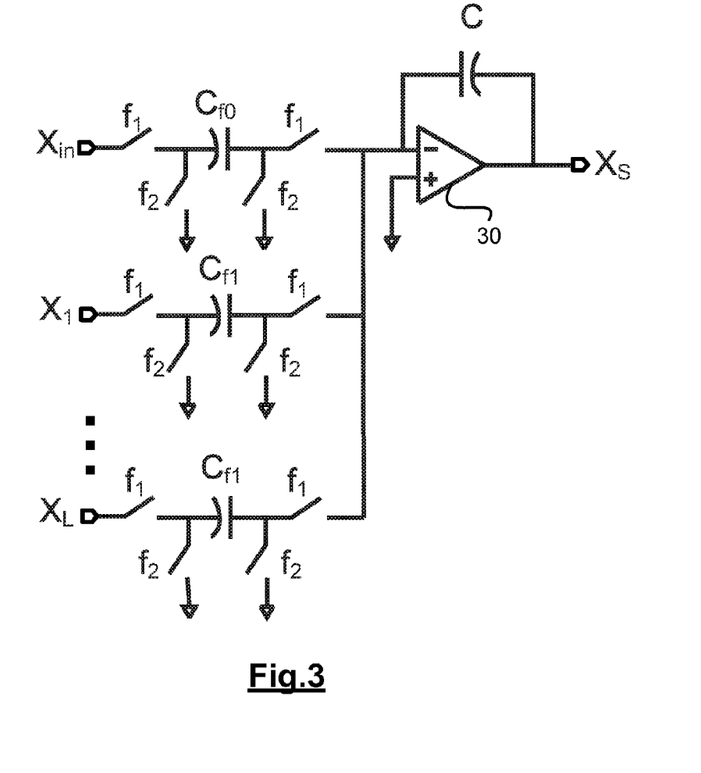
FIG. 3 represents a circuit for an active addition.

The second option is to perform the addition actively. In this approach, the addition at the quantizer input is performed using a switched capacitor configuration as shown in FIG. 3. An amplifier 30 is used in order to perform the required summing function without attenuating the final sum signal. This approach is power consuming as it requires L+1 amplifiers for an L-th order sigma-delta modulator. The output dynamic of the adder amplifier 30 should be maximized in order to relax the quantizer offset requirements.

Multi-bit quantizers used in sigma-delta modulators usually adopt flash topology requiring $2^N-1$ comparators, with N being the number of bits in the quantizer. As a consequence, flash quantizers result being power and area consuming.

Figure 4:
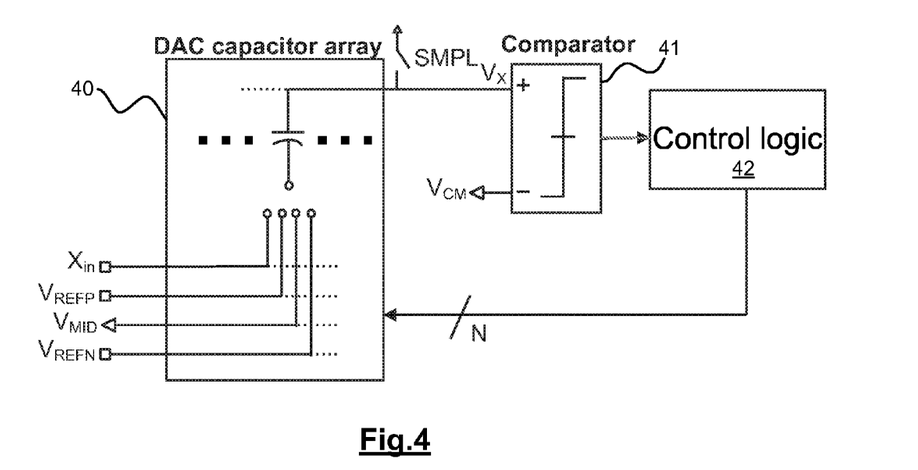
FIG. 4 illustrates a conventional SAR ADC scheme.

A conventional capacitive N-bit SAR analog-to-digital converter as in FIG. 4 (showing a single ended schematic of a fully-differential implementation) employs a comparator 41, a shift register (part of the SAR control logic block 42) and a capacitive Digital-to-Analog Converter (DAC) array 40. Following a binary search algorithm, the DAC approximates the input signal. The DAC capacitor array 40 can be implemented by a binary weighted capacitor or by a split capacitor array. Typically a capacitor is associated to each bit.

The conventional SAR algorithm performed on a sample of the input analog signal follows three phases:

Sampling phase: Input signal $X_{in}$ is sampled on the capacitor array. The signal SMPL is high and connects the top plate of the capacitor array to $V_{CM}$.

Bit cycling: The successive approximation algorithm approximates the input signal one bit at the time from the Most Significant Bit (MSB) to the Least Significant Bit (LSB). During each cycle, the bottom plate of the capacitor associated to the bit being evaluated is first connected to the positive reference voltage $V_{REFP}$. If the voltage $V_X$ is larger than the $V_{CM}$, the capacitor bottom plate is maintained at $V_{REFP}$. Otherwise it is connected to $V_{REFN}$. At the end of this phase the analog sample is approximated by the DAC as $$V_{DAC} = \sum_{j=1}^{N} 2^{(j-1)} \cdot D_j \cdot V_{REF}$$

where $V_{REF}=V_{REFP}-V_{REFN}$, $D_j(=\pm 1)$ is the result of the j-th comparator decision and its value represents the j-th bit.

Purging: The residual charge on the capacitor array is removed before starting a new conversion cycle.

These phases are common to both synchronous and asynchronous implementation of the Successive Approximation algorithm. In feed-forward sigma-delta modulators the SAR conversion happens during the modulator sampling phase (phase $f_1$) so that the output of the multi-bit quantizer is available for the feedback DAC during the integration phase (phase $f_2$).

In the paper "*A 1V 350 µW 92 dB SNDR 24 kHz ΣΔ Modulator in 0.18 µm CMOS*" (Liu et al., ASSCC Dig. Tech. Papers, pp. 1-4, November 2010) a high-precision multi-bit $3^{rd}$-order sigma-delta (ΣΔ) modulator optimized for audio applications is presented. A single loop ΣΔ modulator topology with input feed-forward paths and multi-bit quantizers is applied to deal with the limited power supply. The feed-forward paths are digitized by two successive approximation quantizers (SAQs) and then summed in the digital domain. Although the use of SAQs leads to a more power efficient implementation, two SAQs and a digital adder are still needed. The use of three integrators and two quantizers reduces the stability and increases power and area consumption, when compared to a multi-bit $2^{nd}$-order ΣΔ modulator with only one SAQ.

There is a need for an adder circuit suitable for use in a feed-forward sigma-delta modulator that requires a limited amount of power consumption and area. Further, there is a need for a sigma-delta modulator provided with an efficient adder circuit.

SUMMARY

It is an object of embodiments of the present invention to provide for a low-power circuit for performing analog-to-digital conversion of a sum of a plurality of signals in an efficient way while requiring a limited amount of comparators.

The above objective is accomplished by a circuit for digitizing a sum of signals according to the present invention.

In a first aspect, the invention relates to a circuit for digitizing a sum of at least one first input signal and a plurality of second input signals. The circuit comprises a passive adder circuit arranged for performing a summation of the second input signals and for outputting a summation signal. The circuit further comprises a multi-bit quantizer circuit comprising a comparator arranged for comparing the summation signal applied at a first comparator input terminal with a signal applied at a second comparator input terminal, whereby the signal is derived from the at least one first input signal and has an appropriate polarity so that the difference between the summation signal and the signal is indicative of the sum of the at least one first input signal and the plurality of second input signals. The comparator is further arranged for producing a comparator output signal based on the sum of the at least one first input signal and the plurality of second input signals. The multi-bit quantizer circuit further comprises a control logic block for determining a multi-bit representation of the sum from the comparator output signal.

In the proposed circuit the summation of the various signals is performed in two steps. A passive adder circuit is provided for the addition of the second input signals. The resulting summation signal is applied to an input terminal of a comparator. At the second comparator input terminal another signal is applied which is derived from the at least one first input signal. The polarity of that signal applied at the second input terminal is such that the difference between the summation signal and the signal is indicative of (e.g. proportional to) the sum of the at least one first input signal and the plurality of second input signals. The comparator generates an output signal based on that sum. The multi-bit quantizer circuit comprises, apart from the comparator, a control logic block to which the comparator output signal is fed and wherein a multi-bit representation is determined of the sum of the at least one first input signal and the plurality of second input signals.

The proposed scheme only requires one comparator, as opposed to standard flash ADC schemes, where multiple comparators are used. This way, the power consumption can be reduced. Note that the single comparator performs part of the summation of the signals to be digitized, while in the passive adder circuit the rest of the summation is carried out.

In a preferred embodiment the circuit for digitizing further comprises a digital-to-analog conversion circuit arranged for receiving the multi-bit representation and for generating an adjustment signal to be taken into account when deriving the signal from the at least one first input signal.

Advantageously, the control logic block is arranged for generating a clock signal for the comparator. This allows for an asynchronous implementation. In another embodiment the circuit for digitizing is arranged for receiving an external clock signal. This is the case in a synchronous implementation, where the clock is given to the circuit.

In another preferred embodiment the passive adder circuit is implemented with a first array of capacitors.

In a preferred embodiment the circuit for digitizing comprises a second capacitor array for sampling the at least one first input signal.

In one embodiment the first or the second capacitor array comprises a compensation capacitor.

In one embodiment the first comparator input terminal is positive and the second comparator input terminal is negative.

Advantageously the circuit for digitizing further comprises multiplication means for multiplying the at least one first input signal with a given coefficient.

In yet another preferred embodiment the circuit for digitizing is further arranged for performing a sign inversion on the at least one first input signal before applying it to the multi-bit quantizer circuit. Hence, in this particular case the multiplication coefficient is −1.

In one embodiment the comparator is arranged for performing a scaling of the summation signal applied at the first comparator input terminal and/or of the signal applied at the second comparator input terminal.

The invention also relates to a feed-forward sigma-delta modulator comprising a circuit for digitizing as previously described.

In an advantageous embodiment the sigma-delta modulator comprises at least two integrator stages, whereby the second input signals are output signals of the at least two integrator stages.

In another embodiment the sigma-delta modulator comprises multiplication means for multiplying the second input signals with a feed-forward coefficient before applying them to the passive adder circuit.

In a preferred embodiment the sigma-delta modulator has a differential implementation.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures, and in which.

DETAILED DESCRIPTION OF ILLUSTRATIVE EMBODIMENTS

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention proposes in a first aspect a single circuit for performing both multi-bit quantization and addition of a set of input signals. More in particular, it discloses a circuit for digitizing a sum of a plurality of signals, namely of at least one first input signal and a number of second input signals. In the proposed architecture a passive adder circuit performs part of the addition (for the second input signals), while the only comparator in a multi-bit quantizer circuit is used for performing the remaining part of the addition, i.e. it carries out the addition of the previously obtained sum of the second input signals and the at least one first input signal.

Figure 5:
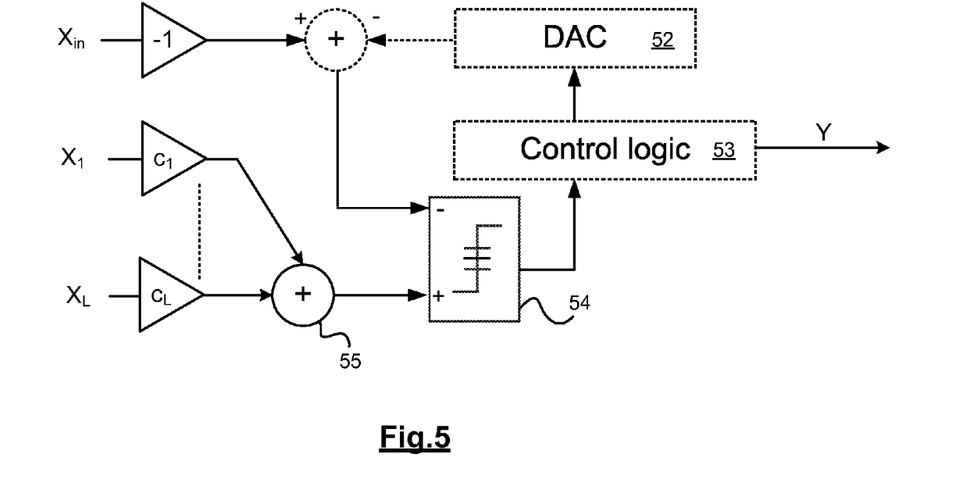
FIG. 5 shows a scheme of an embodiment of the circuit for digitizing a sum of signals according to the present invention.

FIG. 5 represents a scheme of an embodiment of the circuit for digitizing a sum of signals as in the present invention. In this particular case there is one first input signal $X_{in}$ and a set of second input signals, $X_1 \ldots X_L$. This scheme digitizes the weighted summation of the signals with the combined use of a passive adder 55 (for only the summation of the second input signals) and a comparator 54 (that conceptually adds the input signal with the output of the passive adder). A DAC 52 and control logic 53 together with the comparator 54 itself are used here for the actual conversion.

The multi-bit quantizer circuit is in a preferred embodiment of the invention implemented as a successive approximation quantizer, containing the comparator as aforementioned. In this way the power consumption can be reduced.

Figure 6:
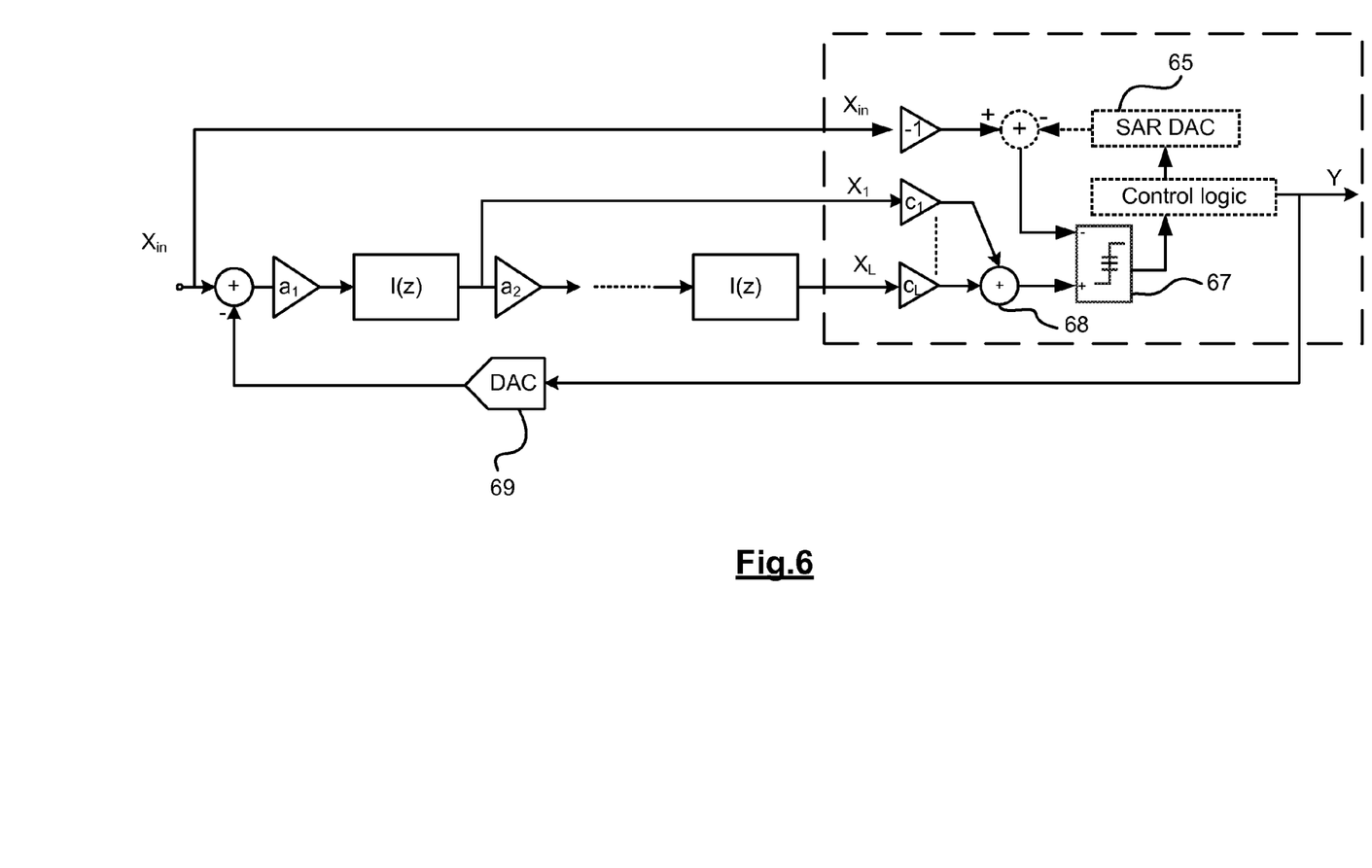
FIG. 6 represents an embodiment of a feed-forward sigma-delta modulator comprising the circuit for digitizing of FIG. 5.

Further features of the circuit for digitizing according to this invention will be explained below, elaborating an embodiment of the circuit wherein successive approximation is applied (see FIG. 6). Further it is assumed that the input signals to the passive adder circuit are state variable signals as they occur in a sigma-delta modulator. However, as already mentioned, this is only one possible, more specific embodiment of the circuit for digitizing a sum of signals. The circuit for digitizing a sum of signals as such is not limited to application in sigma-delta modulators.

In order to sum and digitize the addition signal $X_S = X_{in} + \Sigma_{i=1}^L c_i X_i$, the input signal is in one embodiment sampled on the SAR capacitor array 65 (SAR DAC) connected to the comparator 67 negative terminal, while the sum $\Sigma_{i=1}^L c_i X_i$ is performed with a passive capacitive adder 68 connected to the comparator 67 positive terminal. This is equivalent to performing the SAR conversion with respect to a reference voltage $V_{REF}$ equal to $\Sigma_{i=1}^L c_i X_i$. In order to guarantee that the input signal contributes to the sum $X_S$ with the positive sign the SAR capacitor array 65 (connected to the comparator negative terminal) is fed by the signal $-X_{in}$. In a fully differential implementation of a feed-forward $\Sigma\Delta$ modulator the sign inversion of $X_{in}$ can be achieved by swapping the terminal connection to the SAR inputs with respect to that of the first integrator.

The N-bit SAR quantizer operates by generating $2^N - 1$ thresholds corresponding to $2^N$ levels fed back by the DAC 69. The implementation of the adding SAR in feed-forward $\Sigma\Delta$ modulators depends on the value of FF coefficients. These coefficients are implemented with rational ($\Sigma_{i=1}^L c_i < 1$) or integer ($\Sigma_{i=1}^L c_i > 1$) numbers so that all capacitors can be made a multiple of a unit capacitor $C_u$. A compensation capacitor $C_c$ is needed for a correct summation as will be detailed next for the two following cases: feed-forward coefficients $\Sigma_{i=1}^L c_i < 1$ or $\Sigma_{i=1}^L c_i > 1$.

Figure 7:
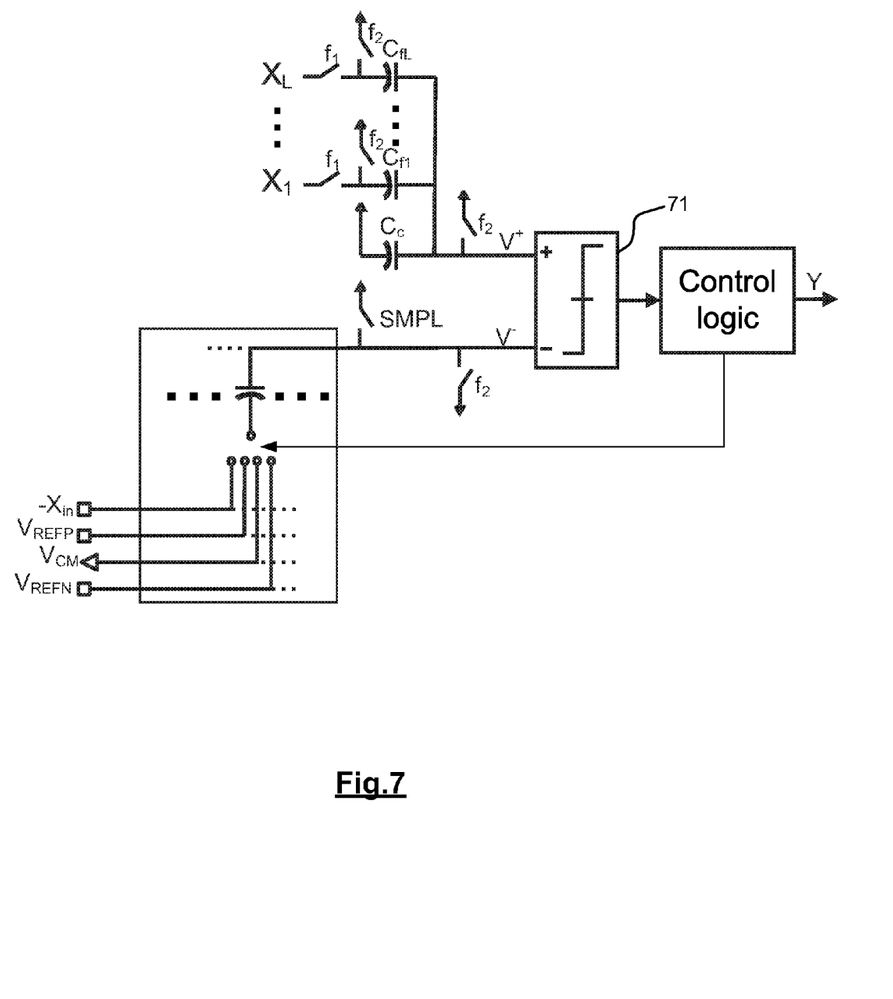
FIG. 7 represents a schematic of a single-ended implementation in case the feed-forward coefficients $\Sigma_{i=1}^{L} c_i < 1$.

A. Feed-Forward Coefficients $\Sigma_{i=1}^L c_i < 1$:

FIG. 7 shows the single ended schematic of the summing SAR in case $\Sigma_{i=1}^L c_i < 1$. During the SAR sampling phase (SMPL signal high), the voltage contribution on the comparator 71 positive terminal is determined by the passive addition of the signals $X_i$ and can be expressed as ($V_{MID}=0$):

$$V^+ = \frac{\sum_{i=1}^L X_i \cdot C_{fi}}{C_c + \sum_{i=1}^L C_{fi}} = \sum_{i=1}^L X_i \cdot \frac{c_i^*}{c_T} = \sum_{i=1}^L X_i \cdot c_i$$

where $C_{fi} = c_i^* C_u$ for ($c_i^* \in N$), $C_c = c_0^* C_u$ and $c_T = \Sigma_{i=1}^L c_i^*$ to guarantee that the voltage contributions from the passive addition are referenced to the same full scale voltage of the SAR capacitive DAC (with LSB voltage $$\left(\text{with LSB voltage } V_{LSB} = \frac{V_{REF}}{2^N - 1}\right)$$

the following condition should be satisfied $c_T = 2^N - 1$. Therefore, $c_i^* = c_i c_T$ and $c_0^* = c_T - \Sigma_{i=1}^L c_i^*$. In conclusion, the summing SAR digitizes the signal $$V^+ - V^- = \sum_{i=1}^L X_i c_i - (-X_{in}) = \sum_{i=1}^L X_i c_i + X_{in}$$

Figure 8:
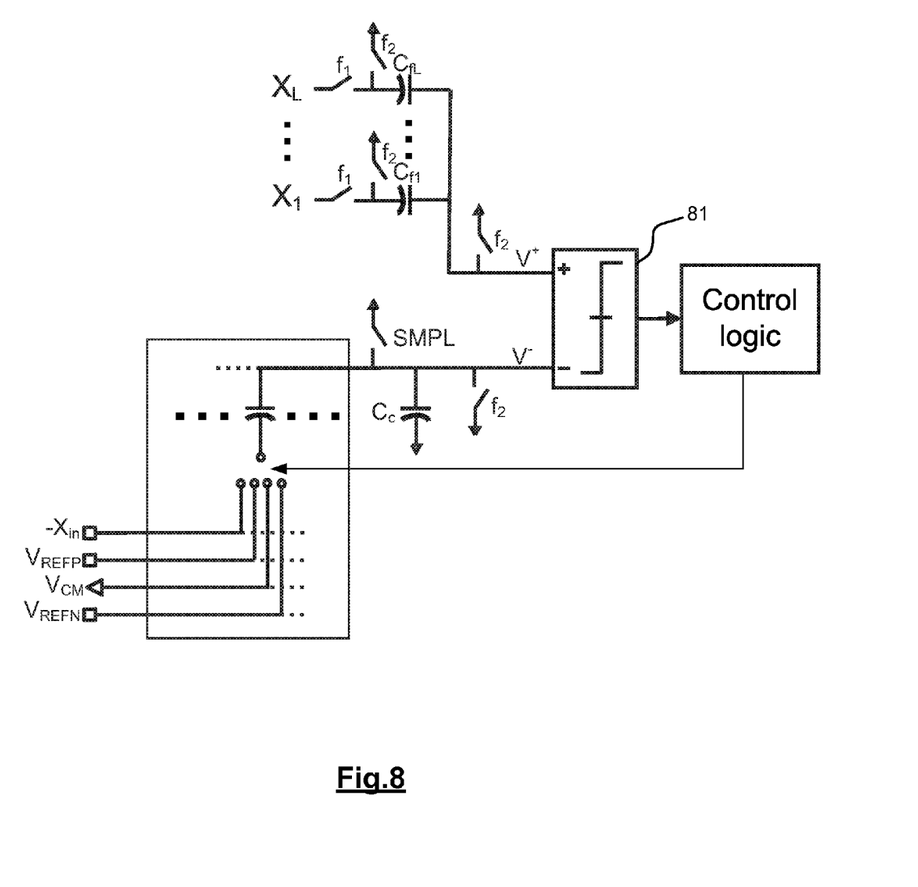
FIG. 8 represents a schematic of a single-ended implementation in case the feed-forward coefficients $\Sigma_{i=1}^{L} c_i > 1$.

B. Feed-Forward Coefficients $\Sigma_{i=1}^L c_i > 1$:

FIG. 8 shows the single ended schematic of the summing SAR in the case $\Sigma_{i=1}^L c_i > 1$. During the SAR sampling phase (SMPL signal high), the voltage contribution on the comparator 81 positive terminal is determined by the passive addition of the signals $X_i$ and can be expressed as ($V_{MID}=0$):

$$V^+ = \frac{\sum_{i=1}^L X_i C_{fi}}{\sum_{i=1}^L C_{fi}} = \frac{\sum_{i=1}^L X_i c_i}{\sum_{i=1}^L c_i} = \sum_{i=1}^L X_i c_i^*$$

where $C_{fi} = c_i^* C_u$ for ($c_i \in N$), and where $c_i^* = c_i / \Sigma_{i=1}^L c_i$.

Therefore, the sum of the signals $X_i c_i$ is attenuated by the factor $\Sigma_{i=1}^L c_i$. In order to attenuate the signal $X_{in}$ a capacitor $C_c = C_{SAR} \cdot \Sigma_{i=1}^L c_i$ is added in parallel with the SAR capacitor array at the beginning of the bit cycling phase. $C_{SAR}$ is the total capacitance of the SAR array on which the input signal is sampled.

It should be pointed out that it is possible to perform the sum of the signals $X_i$ on the comparator positive terminal with an active addition instead of a passive one. Although an extra amplifier is needed its specifications in terms of output dynamic range are significantly relaxed translating in low power consumption.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A circuit for digitizing a sum of at least one first input signal and a plurality of second input signals comprising:
    a passive adder circuit implemented with a first capacitor array and arranged for performing a summation of the plurality of second input signals and for outputting a summation signal;
    a second capacitor array arranged for sampling the at least one first input signal, wherein at least one of the first capacitor array or the second capacitor array includes a scaling capacitor arranged for scaling down the summation signal or the at least one first input signal, respectively, so that the summation signal and the at least one first input signal are in the same voltage range;
    a comparator arranged for comparing the summation signal applied at a first comparator input terminal with a signal applied at a second comparator input terminal, the signal at the second comparator input terminal being derived from the at least one first input signal and having an appropriate polarity so that the difference between the summation signal and the signal at the second comparator input terminal is indicative of the sum of the at least one first input signal and the plurality of second input signals, the comparator further arranged for producing a comparator output signal based on the sum of the at least one first input signal and the plurality of second input signals; and
    a control logic block for determining a multi-bit representation of the sum from the comparator output signal.

2. The circuit for digitizing as in claim 1, further comprising a digital-to-analog conversion circuit arranged for receiving the multi-bit representation and for generating an adjustment signal to be taken into account when deriving the signal applied at a second comparator input terminal from the at least one first input signal.

3. The circuit for digitizing as in claim 1, wherein the control logic block is arranged for generating a clock signal for the comparator.

4. The circuit for digitizing as in claim 1, wherein the circuit is arranged for receiving an external clock signal.

5. The circuit for digitizing as in claim 1, wherein the first comparator input terminal is positive and the second comparator input terminal is negative.

6. The circuit for digitizing as in claim 1, further comprising multiplication means for multiplying the at least one first input signal with a given coefficient.

7. The circuit for digitizing as in claim 6, wherein the circuit is arranged for performing a sign inversion on the at least one first input signal before applying it to the comparator.

8. The circuit for digitizing as in claim 1, wherein the comparator is arranged for performing a scaling of the summation signal applied at the first comparator input terminal.

9. The circuit for digitizing as in claim 1, wherein the comparator is arranged for performing a scaling of the signal applied at the second comparator input terminal.

10. The circuit for digitizing as in claim 1, wherein the circuit is included in a sigma-delta modulator.

11. The circuit for digitizing as in claim 10, wherein the sigma-delta modulator comprises at least two integrator stages, whereby the second input signals are output signals of the at least two integrator stages.

12. The circuit for digitizing as in claim 10, wherein the sigma-delta modulator comprises multiplication means for multiplying the second input signals with a feed-forward coefficient before applying them to the passive adder circuit.

13. The circuit for digitizing as in claim 10, wherein the sigma-delta modulator has a differential implementation.

* * * * *